United States Patent [19]

Shiba et al.

[11] 4,221,858

[45] Sep. 9, 1980

[54] PROCESS FOR PREPARING A PLANOGRAPHIC PRINTING PLATE

[75] Inventors: Keisuke Shiba; Kesanao Kobayashi, both of Shizuoka, Japan

[73] Assignee: Fuji Photo Film Co., Ltd., Ashigara, Japan

[21] Appl. No.: 928,498

[22] Filed: Jul. 27, 1978

Related U.S. Application Data

[63] Continuation-in-part of Ser. No. 807,612, Jun. 17, 1977, abandoned.

[30] Foreign Application Priority Data

Jun. 18, 1976 [JP] Japan ................................ 51-71546

[51] Int. Cl.$^2$ ............................. G03C 5/00; G03F 7/02
[52] U.S. Cl. ................................. 430/266; 430/302; 430/627; 430/949
[58] Field of Search ................. 96/33, 68, 67, 35.1, 96/60 R, 27 R, 94 R, 96 BF, 95, 36.3

[56] References Cited

U.S. PATENT DOCUMENTS

| | | | |
|---|---|---|---|
| T825,262 | 11/1969 | Yackel | 96/33 |
| 3,615,443 | 10/1971 | Smith | 96/68 |
| 3,632,342 | 1/1972 | Salesin et al. | 96/68 |
| 3,642,475 | 2/1972 | Vrancken et al. | 96/60 R |
| 3,642,480 | 2/1972 | Vrancken et al. | 96/27 R |
| 3,852,066 | 12/1974 | Levy | 96/94 BF |
| 3,852,067 | 12/1974 | Levy | 96/94 R |

FOREIGN PATENT DOCUMENTS

| | | | |
|---|---|---|---|
| 681138 | 11/1966 | Belgium | 96/94 R |
| 1139891 | 1/1969 | United Kingdom | 96/94 R |
| 52/2520 | 1/1977 | Japan | 96/94 R |

OTHER PUBLICATIONS

The Theory of the Photographic Process, 3rd ed., 1966, MacMillan Co., N.Y., pp. 304–311. (Mees et al.).

*Primary Examiner*—Travis Brown
*Attorney, Agent, or Firm*—Sughrue, Rothwell, Mion, Zinn and Macpeak

[57] ABSTRACT

In a process for preparing a planographic printing plate which comprises imagewise exposing a silver halide photosensitive material comprising a support having thereon a tanning-developable silver halide photosensitive layer; tanning developing the exposed photosensitive material and washing out the untanned areas of the photosensitive layer; the improvement comprising the silver halide photosensitive layer further contains finely divided particles of an oleophilic synthetic resin in which the particles are substantially insoluble in water, are non-permeable to an alkaline solution and are not dissolved during the tanning development.

20 Claims, No Drawings

PROCESS FOR PREPARING A PLANOGRAPHIC PRINTING PLATE

CROSS-REFERENCE TO RELATED APPLICATIONS

This application is a continuation-in-part application of copending application, Ser. No. 807,612, filed June 17, 1977, now abandoned.

BACKGROUND OF THE INVENTION

1. Field of the Invention

This invention relates to a process for preparing a planographic printing plate using silver halide photosensitive materials which are tanning-developable. More particularly, this invention relates to a process for preparing a planographic printing plate using photosensitive materials forming a tough relief image.

2. Description of the Prior Art

Hitherto silver halide photosensitive materials which can be tanning developed to form relief images are known, e.g., as disclosed in F. J. Drago et al *Image Technology*, Vol. 15, No. 1 page 20 (1973). However, all of the images formed by these photosensitive materials are physically weak and, furthermore, have low resistance to other chemicals. It is known to form a relief image on a support having a hydrophilic surface in a similar manner and to use the thus obtained silver halide photosensitive material as a printing plate, e.g., as disclosed in U.S. Pat. Nos. 2,751,295, 3,402,045, 3,364,024 and 3,669,018 and U.S. Defensive Publications T. 875,030 and T. 825,262. However, this relief image has a low degree of ink receptivity and also has low abrasion resistance and, therefore, this printing plate is used only in the field of office copying. An object of this invention is to overcome these defects of prior art materials.

SUMMARY OF THE INVENTION

A first object of this invention to provide a process for producing a planographic printing plate using silver halide photosensitive materials which have excellent ink receptivity and forming an image having excellent physical properties.

A second object of this invention to provide a process for producing printing plates having a high sensitivity and a high resistance to printing.

A third object of this invention to provide a process for producing a planographic printing plate employing silver halide photosensitive materials which easily form a relief image and which have excellent tone reproducibility.

These and other objects of this invention will become apparent from the following description.

As a result of a large amount of research, it has now been found that the above objects are accomplished in a process for preparing a planographic printing plate which comprises imagewise exposing a silver halide photosensitive material comprising a support having thereon a tanning-developable silver halide photosensitive layer; tanning developing the exposed photosensitive material and washing out the untanned areas of the photosensitive layer; the improvement comprising the silver halide photosensitive layer further contains finely divided particles of an oleophilic synthetic resin in which the particles are substantially insoluble in water, are non-permeable to an alkaline solution and are not dissolved during the tanning development.

DETAILED DESCRIPTION OF THE INVENTION

The oleophilic synthetic resins used in this invention are, preferably, oleophilic polymers, oligomers or compounds having a relatively high molecular weight, e.g., more than about 500. More specifically a suitable molecular weight range for the polymer materials ranges from about 5000 to about 100,000 and for the oligomer materials ranges from about 500 to about 5000. These resins provide an oleophilic surface. These synthetic resins are dispersed in the form of finely divided particles together with the silver halide grains in a photosensitive layer. The finely divided particles of the synthetic resin are not dissolved during the tanning development. A suitable solubility in water is a solubility of less than about 25 wt.%, preferably less than 0.1 wt.%, in water at 25° C. Moreover, these particles do not necessarily need to be spherical. Preferably, the particle size of the particles is about $0.01\mu$ to about $100\mu$, preferably about $0.01\mu$ to about $10\mu$, most preferably $0.01\mu$ to $1\mu$.

The degree of oleophilicity of the resin can be evaluated using the surface obtained by coating the synthetic resin thereof in a coating thickness of greater than about $2\mu$ on a support. That is to say, the degree of oleophilicity can be evaluated by measuring the contact angle of water in kerosine $\theta$ w/o and the contact angle of kerosine in water $\theta$ w/w at normal temperature, e.g., 24° C., and obtaining the difference between these contact angles $\theta = -[\theta o/w - \theta w/o]$. In this case, it is desired for the value of $\theta$ to be positive. Contact angles and their measurement are described in general in *Jikken Kagaku Koza* (*Lecture on Experimental Chemistry*) published by Maruzen Co. Vol. 7 pp 74–85 (1971) and the contact angles $\theta$ o/w and $\theta$ w/o in particular can be measured by the "Captive Bubble Method" described in Mitsuo Obana, "Wetting Phenomenon of Lithographic Plate", *Japan Printer*, 25 (Oct. 1968). A $\theta$ o/w of 0° to less than 90° is considered to be oleophilic and a $\theta$ w/o of 90° or higher is considered to be hydrophilic and thus the expression $\theta = -[\theta o/w - \theta w/o]$ is a measure of the ink receptivity and such is preferably greater than about 30°.

The synthetic resin is non-permeable to alkaline solutions and this property can be appreciated from the fact that a photosensitive material obtained by providing a silver halide emulsion layer of a thickness of about $2\mu$ on a support as shown in Example 1 described hereinafter and providing thereon a layer of the particles of the oleophilic resin used in this invention in a coating thickness of greater than $2\mu$ exhibits only an optical density of less than 50% as compared with a photosensitive material not containing a resin layer, when sufficiently exposed to light and then developed for 60 seconds using a developer as shown in Example 1 described hereinafter.

Suitable examples of oleophilic synthetic resins which can be used include, e.g., polyesters, polyamides, phenol-aldehyde resins, polyvinyl acetate, polyvinyl chloride, polyurethanes, polyacrylates, epoxy resins, silicone resins, polyamines, etc. Of these resins, polymers, copolymers and oligomers such as polyvinyl acetate, polyvinyl chloride, polyurethanes, polyesters and polyacrylates (e.g., methyl, ethyl, propyl, butyl, etc.) are preferred. Binders usually employed for photosensitive lithographic printing plates, photo-cross-linkable polymers, photopolymerizable oligomers, and the like can be used individually or as a combination thereof. Specific examples of suitable binders include phenol-aldehyde resins, the 2-hydroxyethylmethacrylate/methylmethacrylate/acrylonitrile/methacrylic acid copolymer having a molecular weight of about 30,000 as disclosed in U.S. Pat. No. 4,123,276, and novolak type phenol-aldehyde resins.

Hydrophilic colloids which can be used as a dispersion medium are hydrophilic colloids usually employed for silver halide emulsions, such as gelatin, gelatin derivatives, polymethacrylamide, polyvinyl alcohol, polyacrylic acid and polyvinylimidazole. Of these, hydrophilic colloids which can be tanned during development are preferred, and more preferred are hydrophilic colloids containing primary amino groups.

The finely divided particles of the oleophilic synthetic resin of this invention are dispersed in a hydrophilic colloid layer together with silver halide grains of the photo-sensitive material.

A preferred amount of the finely divided particles of the olephilic synthetic resin can range from about 10% to about 150% by weight, more preferably from 30% to 125% by weight based on the weight of the hydrophilic colloid contained in the hydrophilic colloid layer.

The oleophilic synthetic resin can be incorporated as solid particles into the hydrophilic colloid layer. Also, the resin can be incorporated in combination with a water-insoluble solvent having a boiling point higher than 200° C. at a 1 atm. such as di-n-butyl phthalate, tri-o-cresyl phosphate, tri-n-hexyl phosphate, etc.

Examples of silver halides which can be used in this invention include silver chloride, silver bromide, silver iodide and mixed silver halides thereof. A suitable average grain size for the silver halide can range from about 0.03 to about 2µ, preferably 0.03 to 0.5µ. They can be employed as either chemically or spectrally sensitized grains or unsensitized grains and can be either a surface latent image type or an internal latent image type, which can usually be employed as a silver halide photosensitive material. Silver halides orthochromatically sensitized (in the wavelength range of about 380 to about 500 mµ) are preferred. Examples of suitable binders for the silver halide emulsion include hydrophilic colloids generally used in conventional silver halide emulsions e.g., gelatin, gelatin derivatives, polymethacrylamide, polyvinyl alcohol, polyacrylic acid. Of these, a hydrophilic colloid capable of being tanned in development is preferred, and a hydrophilic colloid containing a primary amino group such as gelatin is particularly preferred.

Tanning development used in this invention refers to the development process as described in C. E. Mees, *The Theory of the Photographic Process* (Revised Ed.), pp 580–584, John Wiley & Sons, New York, in which a hardening reaction is caused by imagewise exposure. A chemical structural feature of the developing agents is that they are benzenes or derivatives thereof in which each contains at least one hydroxy group and preferably, polyhydroxybenzenes substituted with halogen atoms such as chlorine, bromine, iodine or fluorine; aryl groups; amino groups; alkyl groups having 1 to 6 carbon atoms or substituted alkyl groups; or/and alkoxy groups.

Specific examples of suitable tanning developing agents include hydroquinone, toluhydroquinone, chlorohydroquinone, pyrogallol, resorcinol, hexylresorcinol, phloroglucinol, 4-benzylcatechol, 4-phenylcatechol and the like. The tanning developing agent can be incorporated into a silver halide emulsion layer or a hydrophilic colloid layer adjacent the silver halide emulsion layer, e.g., a protective layer, a subbing layer, etc., or into a developing solution. The tanning developing agent is preferably incorporated into a silver halide emulsion layer.

When the tanning agent is incorporated into the silver halide emulsion layer, a suitable amount thereof can range from about 0.5 to about 2.5 mols, preferably 0.5 to 1.5 mols, per mol of silver halide. In this embodiment, an aqueous alkaline solution is used as a developing solution, for example, an aqueous solution of an alkali such as sodium hydroxide, potassium hydroxide, sodium carbonate, potassium carbonate, borax, triethanolamine, diethanolamine and the like, having pH of about 9 to about 13, preferably 10 to 12.5, most preferably 11.0 to 12.0. This aqueous alkaline solution may optionally contain an anti-foggant such as potassium bromide, 5-methylbenzotriazole, mercaptobenzimidazole, etc. Suitable processing conditions using the above-described aqueous alkaline solution are generally at a temperature of about 20° C. to about 50° C., preferably 25° C. to 35° C., for about 30 seconds to about 5 minutes, preferably 30 seconds to about 2 minutes. Subsequent to the tanning development the unexposed areas are simply washed out with warm water at a temperature of higher than about 35° C., preferably about 35° C. to about 50° C., most preferably 35° C. to 45° C. to produce relief images. The silver halide photosensitive material of this invention can be imagewise exposed to light, tanning-developed and then the non-exposed portion washed off to obtain a relief image. In particular, the relief image has excellent ink receptivity since it is oleophilic and, therefore, can be used as a printing plate. Further, a post treatment (i.e., a subsequent irradiation with ultraviolet light, or a heat-treatment) are preferably performed whereby the physical strength is improved.

Japanese Patent Application (OPI) No. 2520/1977 (corresponding to U.S. patent application Ser. No. 588,334, filed June 19, 1975, now abandoned) discloses a light-sensitive material useful in the graphic arts comprising a first phase structure such as a photosensitive compound whose solubility in a particular solvent changes upon irradiation and a second phase matrix material such as a non-photosensitive material not soluble in the solvent but forming a matrix for dispersion of the first phase material. However, relief images upon tanning development as in this invention are not obtained with this prior art material.

Examples of supports which can be used in this invention include, e.g., synthetic resin films such as cellulose acetate or polyethylene terephthalate, laminated films thereof, synthetic papers, base papers, papers laminated with, e.g., a polyolefin, synthetic resin film, metallic sheets such as aluminum or zinc, papers or films laminated with such a metallic foil, etc. A support having a hydrophilic surface is preferred. Of these, aluminum sheets are preferred for printing and, in particular, those having a grained surface or having an aluminum oxide layer provided by an anodic oxidation treatment are particularly preferred.

If desired, a subbing layer may be employed between the support and the silver halide emulsion layer. Suitable examples of subbing layers are those of hydrophilic polymers such as gelatin, gelatin derivatives, polyvinyl alcohol, polyvinyl pyrrolidone, polyvinyl imidazole, preferably those of tanning-developable hydrophilic polymers having a primary amino group.

The silver halide photosensitive material of this invention can be appropriately exposed using various techniques, e.g., contact exposure, enlarging exposure, etc. using light from light sources such as a tungsten lamp, a xenon lamp, using electron beam irradiation, etc. A suitable exposure time can range from about $10^{-5}$ seconds (flash exposure) to about 100 seconds. A preferred exposure is an enlarging exposure using light from a tungsten lamp or a xenon lamp. A particularly preferred exposure time is 1 to 10 seconds or $10^{-5}$ seconds of flash exposure to light from a xenon lamp.

A suitable coating amount of the silver halide emulsion layer ranges from about 0.1 to about 15 g/m² of the support. A suitable coating amount of a protective layer when present and a subbing layer when present can range from about 0.05 to about 2 g/m² and about 0.05 to about 2 g/m² respectively.

The following examples are given to illustrate this invention in greater detail without limiting the same. Unless otherwise indicated all parts, percentages, ratios and the like are by weight.

EXAMPLE 1

A 2S aluminum sheet of a thickness of 0.24 mm was degreased and grained in a hydrochloric acid aqueous solution of a concentration of about 1% by passing therethrough an alternating current of about 10 volts for about 20 minutes at about 30° to about 36° C. Then, the sheet was washed with water and dried. A gelatin layer of a dry thickness of about 0.2μ was provided thereon and, further, a silver bromoiodide emulsion layer of a dry thickness of about 4.0μ was provided in the following manner to obtain Sample 1.

| Composition 1 | |
|---|---|
| Silver Bromoiodide Gelatin Emulsion (containing 57 g of gelatin and 0.32 g equivalent of silver bromoiodide containing 1 mol% of iodide ion per kg of emulsion; average grain size of 0.12 μ) | 500 g |
| Dispersion of Oleophilic Resin 1 | 250 g |

Preparation of Oleophilic Synthetic Resin Dispersion I

A polymer having therein the following repeating unit:

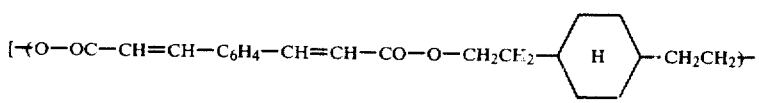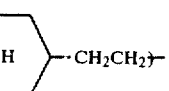

molecular weight: about 10,000] was dissolved in a mixed solution of ethyl acetate and ethylene chloride (in a volume ratio of 1:1) to make a 10 wt.% solution of the polymer. 50 ml of this polymer solution was added to 200 ml of a 5 wt.% solution of acid-treated gelatin kept at 50° c. and, further, 4 ml of a 2 wt.% solution of sodium nonylbenzene-sulfonate was added. The resulting mixture was stirred at high speed using a homoblender to produce an emulsififed dispersion.

For comparison, Composition I was prepared using 250 ml of water in place of the Oleophilic Synthetic Resin Dispersion I, melted, coated and dried to obtain Sample 2.

After imagewise exposure to light from a xenon lamp through a transparent negative original using a camera for producing a printing plate with an image enlargement of 4 times, the samples were developed at 24° C. for 90 seconds using the following Developer I, the non-exposed portions washed off using warm water at 45° C. and the plate dried.

| Developer 1 | |
|---|---|
| Pyrrogallol | 3 g |
| Metol | 1 g |
| Sodium Carbonate (anhydrous) | 112.5 g |
| Potassium Bromide | 1.5 g |
| Citric Acid | 1.0 g |
| Sodium Polymetaphosphate | 1.0 g |
| Water | to 1000 ml |
| | (pH = 10.8) |

Next, the samples were irradiated with 25,000 lux of ultraviolet light for 60 seconds at a distance of 1 m from a PS light (using a metal halide lamp) made by Fuji Photo Film Co., Ltd. Printing was done using the thus obtained printing plates using a printer (ROTA PRINT R-40/K-30) using an ink (F-gloss type, produced by Toyo Ink Co., Ltd.) followed by application thereto of a gum solution (GP, produced by Fuji Photo Film Co., Ltd.) and using water as a fountain solution. The results obtained are shown in Table 1 below.

Table 1

| Sample No. | Ultraviolet Irradiation | Ink receptivity* | Spoilage** | Length of Press Run |
|---|---|---|---|---|
| 1 | No | + 28 | 9 | More than 10,000 |
| 1' | Yes | + 45 | 8 | More than 20,000 |
| 2 (for comparison) | Yes | − 56 | More than 200 | 2000 |

*Ink Receptivity = Degree of oleophilicity = θ = − [θo/w−θw/o] of the samples when they were coated on a smooth aluminum surface.
**Number of papers wasted before sufficient quality prints could be obtained.

EXAMPLE 2

The same procedures as in Example 1 were repeated except that 50 ml of a 10 wt.% of an oleophilic polymer having 5 g of 4-phenylcatechol dissolved therein was used in place of 50 ml of the 10 wt.% solution of the oleophilic polymer in the mixed solution of ethyl acetate and ethylene chloride (in a volume ratio of 1:1), thus obtaining Sample 3.

A printing plate was prepared in the same manner as in Example 1 except that development was done using the following Developer II in place of Developer I.

| Developer II | |
|---|---|
| Sodium Carbonate (anhydrous) | 112.5 g |
| Potassium Bromide | 1.5 g |
| Sodium Polymetaphosphate | 1.0 g |
| Water | to 1000 ml |

Printing was done using the thus obtained printing plate using a printer (ROTA PRINT R-40/K-30) in the manner described in Example 1. The results obtained are shown in Table 2 below.

Table 2

| Sample No. | Ultraviolet Irradiation | Spoilage* | Length of Press Run |
|---|---|---|---|
| 3 | Yes | 5 | More than 15,000 |

*Number of papers wasted before sufficient quality prints could be obtained.

Sample Nos. 1 and 3 of this invention exhibited remarkably improved ink receptivity and resistance to printing as compared with Sample No. 2 for comparison.

On the support of Example 1, the same silver bromoiodide gelatin emulsion as used in Composition 1 was coated in a dry coating thickness of $2\mu$ to obtain Sample 4. A 10 wt.% solution of the polymer dissolved in the mixed solvent of ethyl acetate and ethylene chloride as described in Example 1 was used to provide a synthetic resin layer of a dry thickness of $2\mu$, thus obtaining Sample 5. Samples 4 and 5 were exposed to light of 100 lux for 10 seconds and developed at 24° C. for 60 seconds using Developer I described in Example 1. Sample 4 exhibited a reflection density of greater than 2.2, while Sample 5 exhibited only a reflection density of 0.3 and the optical density was remarkably uneven. From these results, it is apparent that the polymer used in Examples 1 and 2 is substantially non-permeable to an alkaline solution.

EXAMPLE 3

5 g of catechol and 100 parts of propyl alcohol were mixed with 200 parts of a 2% by weight gelatin aqueous solution. The thus obtained mixed solution was coated on a support as described in Example 1 to provide a subbing layer having a dry thickness of about $0.3\mu$. Thereafter a silver halide photosensitive layer having the following composition was coated thereon in a dry thickness of about $3\mu$.

| Composition II | |
|---|---|
| Silver Chlorobromide Emulsion (containing 55 g of gelatin per kg of emulsion; 30 mol% of Br ion; average grain size 0.4 $\mu$) | 100 g |
| Merocyanine Sensitizing Dye (0.1% methanol solution) | 10 ml |
| Dispersion* of Oleophilic Resin II | 250 g |
| Dispersion* of Oleophilic Resin III | 30 g |
| Water | 860 g |

*As described below

Oleophilic Synthetic Resin Diseprsion II

A solution containing the following components was dispersed in 200 g of a 10% by weight gelatin aqueous solution with 5 g of a 10% by weight of sodium nonylbenzene-sulfonate aqueous solution and the mixture was emulsified at 40° C. using a high speed agitator.

| Solution Components | |
|---|---|
| Vinyl Acetate/Vinyl Chloride/ Maleic Anhydride Copolymer (86:13:1 weight ratio) | 10 g |
| Tricresyl Phosphate | 10 g |
| 4-Phenylcatechol | 5 g |

| Solution Components | |
|---|---|
| Ethyl Acetate | 25 g |

Oleophilic Synthetic Resin Dispersion III

Oleophilic Syntheic Resin Dispersion III was an emulsion of poly(ethyl acrylate) obtained by emulsion polymerization, having a solid content of 46%.

On the silver halide photosensitive layer was coated a solution prepared by adding to 100 parts of ethyl acetate 1 part of the reaction product of 10 parts of a vinyl acetate/vinyl chloride/maleic anhydride copolymer (86:13:1 weight ratio), 2 mol of 2-hydroxyethyl methacrylate and 1 mol of 4,4'-methylenediphenyl diisocyanate, thereby to produce a protective layer having a dry thickness of about $1\mu$.

The thus prepared photosensitive material was imagewise exposed to light from a xenon lamp through a transparent negative original using a camera for producing a printing plate.

A printing plate was prepared using the same procedures as described in Example 2.

The printing plate was mounted on a printer (Heidelberg KOR), and printing was done using an ink (F-gloss type ink, produced by Toyo Ink Co., Ltd.) and high quality paper. 100,000 printings were obtained while the number of papers wasted before sufficient quality prints were obtained was only 5 to 7.

As a comparison, a sample was prepared in the same manner as described above except that the oleophilic resins used in Oleophilic Synthetic Resin Dispersion II and III were not employed. Printing was done in the same manner. However, when about 2,000 prints were obtained, image portions of the printing plate peeled off from the support.

While the invention has been described in detail and with reference to specific embodiments thereof, it will be apparent to one skilled in the art that various changes and modifications can be made therein without departing from the spirit and scope thereof.

What is claimed is:

1. In a process for preparing a planographic printing plate which comprises imagewise exposing a silver halide photosensitive material comprising a support having a hydrophilic surface having thereon a tanning-developable silver halide photosensitive layer; tanning developing the exposed photosensitive material and wasing out the untanned areas of the photosensitive layer to reveal the hydrophilic surface thereby to obtain the planographic printing plate; the improvement comprising the silver halide photosensitive layer further contains finely divided particles of an oleophilic synthetic resin in which the particles are substantially insoluble in water, are non-permeable to an alkaline solution and are not dissolved during the tanning development, and said oleophilic synthetic resin exhibits a positive difference in contact angle $\theta$ where $\theta = ]\theta o/w - \theta w/o]$ in which $\theta o/w$ is the contact angle of kerosine in water, and $\theta w/o$ is the contact angle of water in kerosine.

2. The process of claim 1, wherein said oleophilic synthetic resin has a solubility of less than about 25 wt.% in water at 25° C.

3. The process of claim 1, wherein said oleophilic synthetic resin has a solubility of less than 0.1 wt.% in water at 25° C.

4. The process of claim 1, wherein said oleophilic synthetic resin is at least one selected from the group consisting of polyesters, polyamides, phenol-aldehyde resins, polyvinyl acetate, polyvinyl chloride, polyurethanes, polyacrylates, epoxy resins, silicone resins and polyamines.

5. The process of claim 4, wherein said oleophilic synthetic resin is selected from the group consisting of polyvinyl acetate, polyvinyl chloride, polyurethanes, polyesters and polyacrylates.

6. The process of claim 1, wherein said oleophilic synthetic resin has a molecular weight more than about 500 and is selected from the group consisting of photo-cross-linkable polymers and photopolymerizable oligomers.

7. The process of claim 1, wherein said silver halide photosensitive emulsion is a gelatino silver halide emulsion.

8. The process of claim 7, wherein said finely divided particles of the oleophilic synthetic resin are present in an amount of about 10% to about 150% by weight based on the weight of the gelatin in said gelatino silver halide emulsion.

9. The process of claim 7, wherein said finely divided particles of the oleophilic synthetic resin are present in an amount of 30% to 125% by weight based on the weight of the gelatin in said gelatino silver halide emulsion.

10. The process of claim 8, wherein said finely divided particles have a particle size of about $0.01\mu$ to about $100\mu$.

11. The process of claim 8, wherein said finely divided particles have a particle size of about $0.01\mu$ to about $10\mu$.

12. The process of claim 8, wherein said finely divided particles have a particle size of $0.01\mu$ to $1\mu$.

13. The process of claim 1, wherein said silver halide photosensitive emulsion layer further contains a tanning developing agent.

14. The process of claim 13, wherein said tanning developing agent is present in said photosensitive layer in an amount of about 0.5 mol to about 2.5 mol per mol of silver halide in said photosensitive layer.

15. The process of claim 13, wherein said tanning developing agent is present in said photosensitive layer in an amount of 0.5 mol to 1.5 mol per mol of silver halide in said photosensitive layer.

16. The process of claim 14, wherein said tanning developing agent is selected from the group consisting of hydroquinone, toluhydroquinone, chlorohydroquinone, pyrogallol, resorcinol, hexylresorcinol, phloroglucinol, 4-benzylcatechol and 4-phenylcatechol.

17. The process of claim 1, wherein said support is an aluminum sheet.

18. The process of claim 17, wherein said aluminum sheet has thereon an aluminum oxide layer produced by anodic oxidation.

19. The process of claim 13, wherein said support is an aluminum sheet.

20. The process of claim 19, wherein said aluminum sheet has thereon an aluminum oxide layer produced by anodic oxidation.

* * * * *